United States Patent [19]

Nise

[11] Patent Number: 5,696,468
[45] Date of Patent: Dec. 9, 1997

[54] METHOD AND APPARATUS FOR AUTOCALIBRATING THE CENTER FREQUENCY OF A VOLTAGE CONTROLLED OSCILLATOR OF A PHASE LOCKED LOOP

[75] Inventor: Benjamin E. Nise, San Diego, Calif.

[73] Assignee: QUALCOMM Incorporated, San Diego, Calif.

[21] Appl. No.: 608,925

[22] Filed: Feb. 29, 1996

[51] Int. Cl.⁶ ........................................................ H03L 7/08
[52] U.S. Cl. .................. 331/14; 331/17; 331/18; 331/34; 327/156
[58] Field of Search .................................. 331/1 A, 8, 14, 331/16, 17, 18, 25, 34, 57, DIG. 2; 327/105, 107, 156–159; 360/51; 375/376; 455/260

[56] References Cited

U.S. PATENT DOCUMENTS

| | | | |
|---|---|---|---|
| 5,359,298 | 10/1994 | Abe | 331/14 X |
| 5,382,922 | 1/1995 | Gersbach et al. | 331/14 X |
| 5,410,592 | 4/1995 | Yoshida | 331/14 X |
| 5,414,390 | 5/1995 | Kovacs et al. | 331/14 X |

*Primary Examiner*—David Mis
*Attorney, Agent, or Firm*—Russell B. Miller; Brian S. Edmonston

[57] ABSTRACT

The clock multiplying phase locked loop includes components for selectively setting a center frequency of a voltage controlled oscillator (VCO) to bias the VCO for operation within a selected range of input frequencies. To this end, the VCO is configured to output a signal at a selected center frequency based upon a tuning current provided to the VCO. Initially, a voltage input of the VCO is set to a reference voltage and a feedback signal is generated. The feedback signal, perhaps divided by N, is input to a phase-frequency detector. The phase-frequency detector also receives a reference frequency signal having a frequency at the selected center frequency. The detector outputs an UP or DOWN signal indicating whether the feedback signal is greater or less than the reference frequency signal. A center frequency adjustment unit receives the UP or DOWN signals from the detector and adjusts the tuning current to modify the center frequency of the VCO to reduce any difference between the feedback frequency and the reference frequency received by the phase-frequency detector. The VCO, the detector and the adjustment unit, as well as other components, operate in a loop causing the center frequency of the VCO to be iteratively adjusted until the center frequency approximates the selected center frequency to a selected degree of resolution. At that point, the voltage reference signal is disconnected from the voltage input of the VCO and the frequency reference signal is disconnected from the input of the phase-frequency detector, thus allowing the clock multiplier to operate as a phase locked loop (PLL). The tuning current, however, continues to be applied to the VCO to maintain the center frequency of the VCO at the selected center frequency such that further operation of the VCO is biased to that center frequency. Method and apparatus embodiments of the invention are disclosed.

13 Claims, 5 Drawing Sheets

METHOD AND APPARATUS FOR AUTOCALIBRATING THE CENTER FREQUENCY OF A VOLTAGE CONTROLLED OSCILLATOR OF A PHASE LOCKED LOOP

BACKGROUND OF THE INVENTION

I. Field of the Invention

The invention generally relates to clock multiplying phase locked loops and in particular to a clock multiplying phase locked loop circuit having a voltage controlled oscillator (VCO).

II. Description of the Related Art

Clock multipliers are commonly employed within integrated circuits (ICs) for increasing the frequency of an input clock signal. As an example, a clock multiplier may generate a 100 megahertz (MHz) clock signal from an input 25 MHz clock signal. Clock multipliers are particularly useful within systems incorporating several ICs wherein all ICs are driven from a common system bus clock signal but wherein each individual IC may need to operate at a different internal clock rate. By providing clock multipliers, each IC can thereby operate at an optimal internal clock rate. Moreover, clock multipliers allow ICs to operate at a much higher frequency than would normally be feasible on a printed circuit board as a result of limitations in the system clock frequency supplied by the printer circuit board.

FIG. 1 is a block diagram illustrating an exemplary clock multiplier 10 for use in generating an output signal of frequency Nf from an input signal of frequency f. Clock multiplier 10 includes a phase-frequency detector 12, a charge pump 14, a loop filter 16, a VCO 18 and a divide-by-N circuit 20 configured as shown. With this configuration, a feedback path is provided between the VCO and the phase-frequency detector for use in providing a phase-locked loop (PLL). VCO 18 generates a clock signal having a frequency of Nf. Divide-by-N circuit 20 generates a feedback signal by dividing the output signal from the VCO by N to yield a feedback signal of frequency approximately equal to f. Hence, the phase-frequency detector receives both an input frequency f and a feedback frequency near f.

In use, the phase-frequency detector generates a signal representative of differences between the input frequency and the feedback frequency. Loop filter 16 includes one or more capacitors for storing an amount of charge sufficient to generate a voltage representative of the difference in frequency detected by the phase-frequency detector. Charge pump 14 increases or decreases the amount of charge within the capacitors of loop filter 16 in accordance with signals received from the phase-frequency detector to thereby vary the voltage signal generated by the loop filter. The voltage is applied to the VCO which generates an output signal having a frequency of about N times the input frequency as represented by the voltage applied thereto. By providing feedback from the VCO to the phase-frequency detector, the output frequency is maintained very precisely at N times the input frequency after the components of the clock multiplier have achieved a phase lock.

Thus, the clock multiplier includes a VCO configured to convert a input voltage to an output frequency. Often, however, the VCO is configured to operate reliably only within a fairly narrow range of input voltages and output frequencies. As such, the overall clock multiplier may operate only within a fairly narrow range of input frequencies. For example, for a clock multiplier where N equals 4, the multiplier may operate reliably only for input frequencies in the range of 24–26 MHz to produce output frequencies in the range of 96–104 MHz. With such an arrangement, input signals outside of the range of 24–26 MHz may not be reliably multiplied resulting in output signals having frequencies differing from N times the input frequency. Typically, the input range of frequencies is well defined, such that the designer of a VCO can configure the VCO to operate reliably for all expected input frequencies. In this regard, the VCO may be configured to operate around a center frequency, such as 25 MHz, corresponding to a center voltage, such as 0V, such that only deviations from the center voltage yield deviations from the center frequency. In one example, a VCO may be configured to generate an output frequency of 25 MHz in response to an input voltage of 0.

However, for some applications, the range of input frequencies is not known in advance or is known to vary over a wide range of possible frequencies. For such applications, it is desirable to provide a VCO capable of operating over a wide range of input voltages to generate a wide range of output frequencies. For example, rather than provide a VCO which can generate output frequencies only within the range of 96–104 MHz, it would be desirable to instead provide a VCO that can output signals having frequencies within the range of 50–150 MHz and having a center frequency of 100 MHz.

Certain problems arise in designing and fabricating a VCO capable of such a wide range of output frequencies. For example, to accommodate large variations from the center frequency, a large gain is required. With a large gain, however, any disturbances in the power supply, or other sources of noise coupled to the VCO, are amplified by the large gain resulting in excessive jitter to the output signal possibly resulting in an unstable output signal. An unstable output signal may not be usable by other circuitry requiring the signal. Moreover, an unstable output signal may prevent the PLL from achieving a phase lock. Hence the VCO gain cannot be too great. For some practical applications, a VCO range of 10 MHz/V has been found to be tolerable, but anything greater results in the aforementioned instabilities in the output signals. For such VCOs, however, the available range for input control voltages may be only 2 volts. As such, an output range of frequencies is limited to only 20 MHz which is clearly insufficient for applications requiring an output frequency anywhere within the range of 50 MHz–100 MHz.

Another problem with some conventional clock multipliers employing VCOs is that process variations, temperature variations, and the like can significantly affect the center frequency of the VCO thereby skewing the available range of output frequencies. For example, a VCO may be designed to operate within a output frequency range of 5–15 MHz based upon a center frequency of 10 MHz. As a result of process variations, the center frequency may be shifted to 8 MHz resulting in an available output range of 3 MHz–13 MHz. As such, with the center frequency shifted, it may not be possible to reliably generate an output frequency of 14 or 15 MHz.

Thus, conventional clock multipliers of the type described above are not well suited for generating an output frequency within a wide range of frequencies. It would be desirable to provide an improved clock multiplier capable of operating reliably over a wide range of selectable output frequencies and it is to that end that aspects of the present invention are drawn.

SUMMARY OF THE INVENTION

In accordance with the invention, a clock multiplier having a VCO is provided with a means for resetting a center frequency of the VCO to a selected frequency. By providing means for resetting the center frequency of the VCO, a deviation in the center frequency caused by process or other variations may be remedied by resetting the center frequency. Also, by providing means for resetting the center frequency, the VCO can reliably operate over a much wider range of output frequencies using a relatively small VCO gain and a relatively small range of input voltages. For example, with the invention, a VCO may be employed having a output range of only 10 MHz corresponding to an input voltage range of 2 V. Yet by resetting the center frequency of the VCO, the actual output range of frequencies may range from, for example, 50 MHz to 100 MHz.

In one embodiment, the clock multiplier includes a phase-frequency detector, a charge pump, a loop filter and a VCO arranged sequentially between an input signal path and an output signal path. The VCO is configured to generate an output frequency of Nf based upon an input frequency of f. A divide-by-N circuit is connected between an output of the VCO and a feedback input of the phase-frequency detector. The VCO is configured to receive a course tuning current for biasing the VCO to a selected center frequency. The amount of course tuning current is varied to thereby vary the amount of a bias current within the VCO to thereby vary the center frequency of the VCO.

The clock multiplier of the exemplary embodiment also includes a frequency reference source for providing a signal having the selected center frequency and a voltage reference source having a fixed voltage reference. A center frequency adjustment unit is interconnected between the phase-frequency detector and the course tuning input of the VCO for generating an amount of course tuning current based upon signals output by the phase-frequency detector. In use, to reset the center frequency, the frequency reference source is connected to an input of the phase-frequency detector and the voltage reference source is connected to the voltage input of the VCO. The VCO generates an output frequency based upon the fixed input voltage reference signal. The output frequency, divided by N, is fed back into the phase-frequency detector which compares the feedback frequency with the frequency reference signal and generates an output signal representative of any difference therebetween. The adjustment unit receives the output signal from the phase-frequency detector and generates a course tuning current which modifies the center frequency of the VCO thereby modifying the output frequency of the VCO and modifying the difference between the frequency reference signal and the feedback frequency signal. The amount of course tuning current is selected to change the center frequency of the VCO to reduce the difference between the reference frequency and the feedback frequency. Operation proceeds iteratively until the feedback frequency is approximately equal to the reference frequency indicating that the center frequency has been reset to the reference frequency. Then, the reference frequency source is disconnected from the phase-frequency detector and the voltage reference source is disconnected from the voltage input of the VCO. The course tuning current, however, continues to be applied to the VCO to maintain the center frequency of the VCO at the selected center frequency. Thereafter, input signals received by the phase-frequency detector are multiplied by the VCO based upon the new center frequency of the VCO.

In one specific embodiment, the adjustment unit includes a successive approximation logic unit and a digital to analog converter (DAC). The successive approximation logic unit generates a digital signal representative of the analog signal received from the phase-frequency detector. The approximation logic is configured to iteratively approximate the analog signal by adding additional bits of resolution until a desired resolution is achieved. The DAC generates the course tuning current based upon the digital signal generated by the approximation logic unit. The approximation logic unit may be configured as a hardware state machine.

Thus, a clock multiplier is provided wherein the center frequency of a VCO of the clock multiplier may be reset to a selected center frequency. With this improvement the disadvantages of the conventional clock multipliers described above are substantially overcome. Other advantages and features of the invention will be apparent from the descriptions which follow and from the accompanying drawings.

DETAILED DESCRIPTION OF EXEMPLARY EMBODIMENTS OF THE INVENTION

With reference to the remaining figures, exemplary embodiments of the invention will now be described. The exemplary embodiments are described primarily with reference to block diagrams and flowcharts. As to the flowcharts, each block within the flowchart represents both a method step and an apparatus element for performing the method step. Herein, the apparatus element may be referred to as a means for, an element for, or a unit for performing the method step. As to the block diagrams, it should be appreciated that not all components necessary for a complete implementation of a practical system are necessarily illustrated or described in detail. Rather, only those components necessary for a thorough understand of the invention are illustrated and described. Furthermore, components which are either conventional or may be readily designed and fabricated in accordance with the teachings provided herein are not described in detail.

Figure 1:
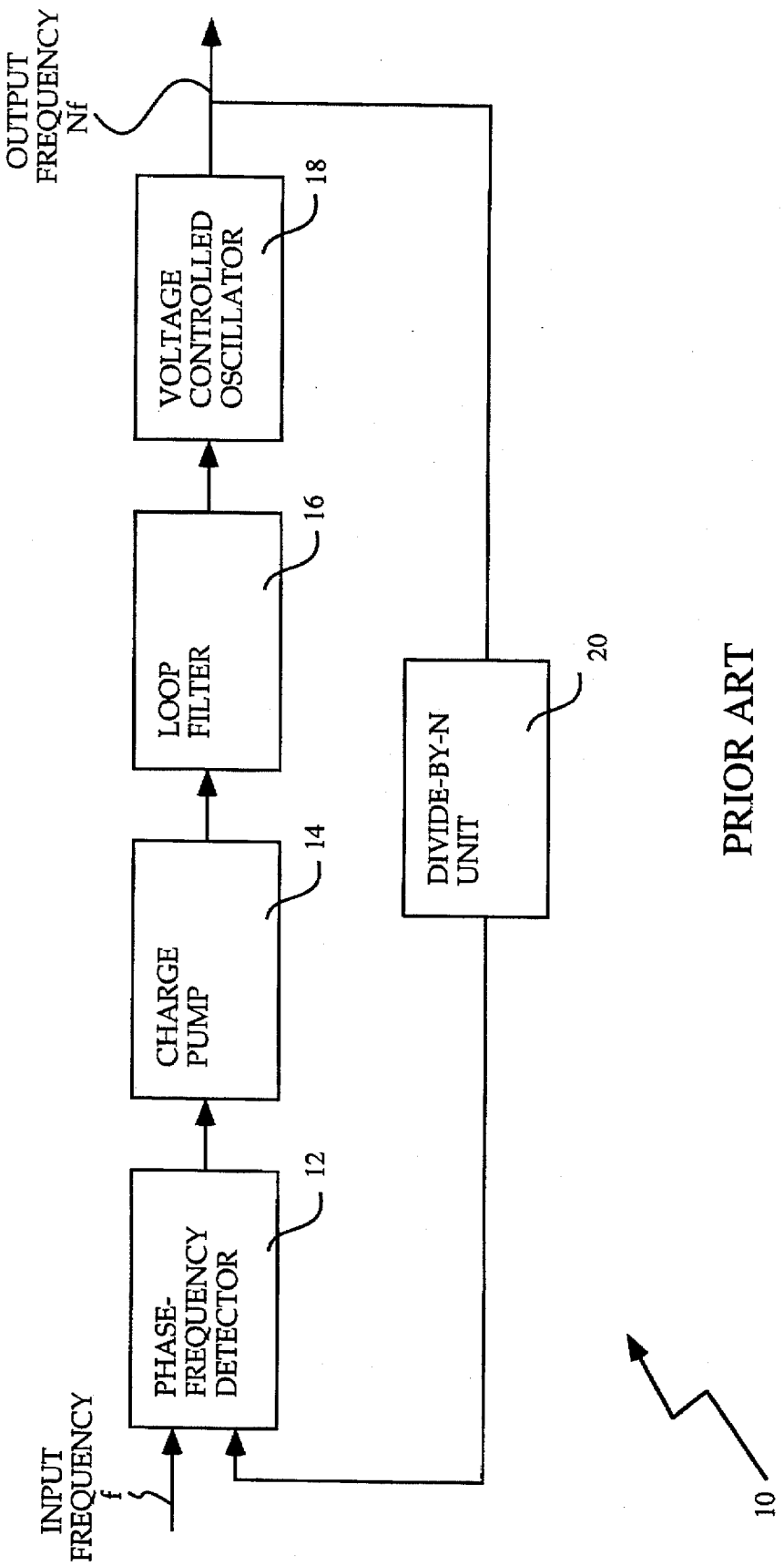
FIG. 1 is a block diagram illustrating a conventional clock multiplying phase locked loop system employing a VCO.
Figure 2:
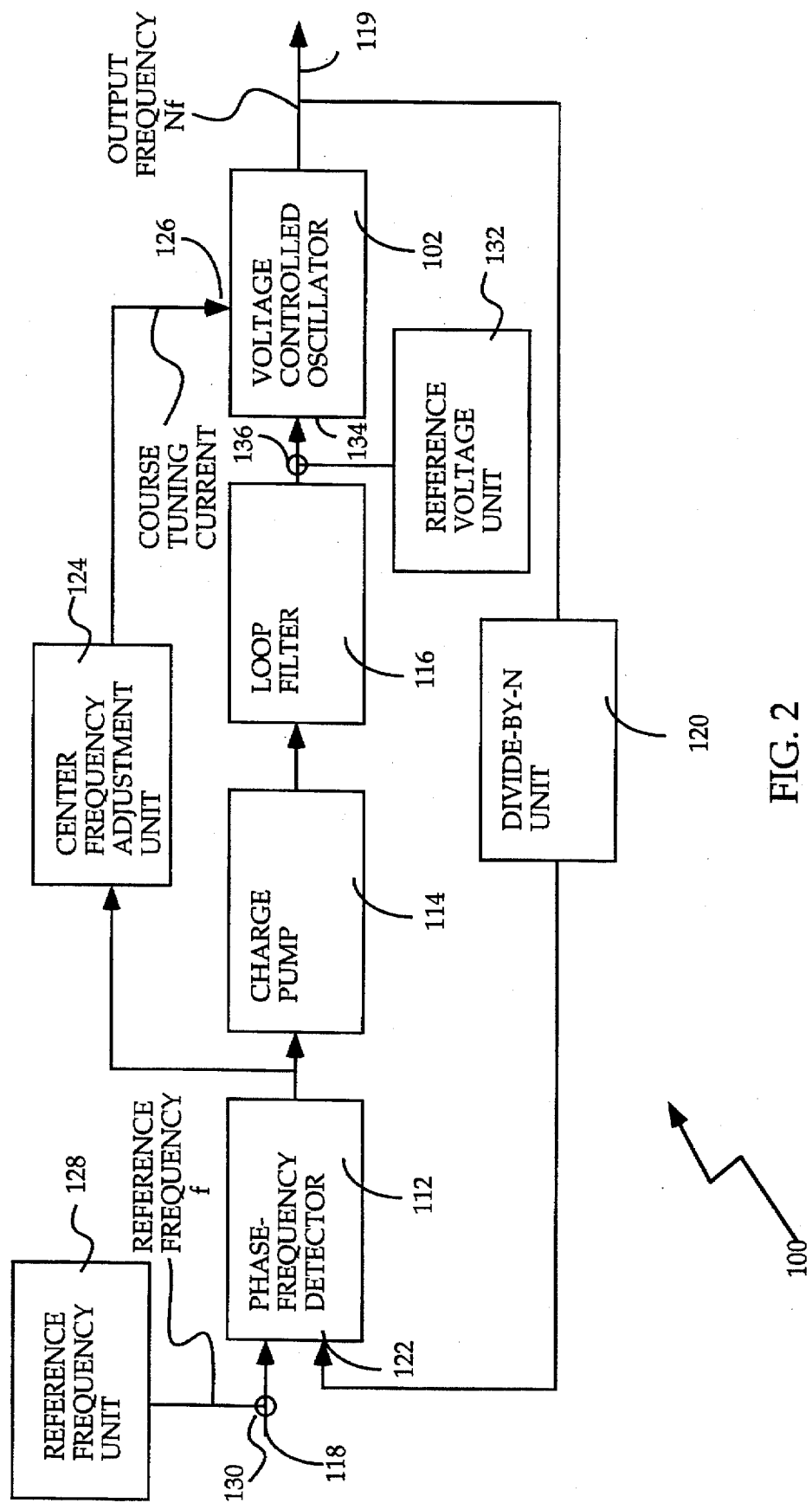
FIG. 2 is a block diagram of a clock multiplying phase locked loop system configured in accordance with an exemplary embodiment of the invention and having a VCO with a resettable center frequency.

FIG. 2 illustrates a clock multiplier 100 having a VCO 102 with a resettable center frequency. Clock multiplier 100 also includes a phase-frequency detector 112, a charge pump 114 and a loop filter 116 connected, in sequence, along with VCO 102, between an input line 118 and an output line 119. A divide-by-N unit 120 interconnects output line 119 with a feedback input 122 of the phase-frequency detector. Phase-frequency detector, the charge pump, the loop filter and the divide-by-N unit may each be similar or identical to the corresponding units described above with reference to FIG. 1 and will not be described in detail. VCO 102, however, differs from the VCO of FIG. 1. Specifically, VCO 102 is configured to receive a course tuning current from a center frequency adjustment unit 124. The adjustment unit is connected between an output of the phase-frequency detector and a course tuning input 126 of the VCO. As will be described in greater detail below, the adjustment unit is configured to provide an amount of current sufficient to adjust the center frequency of the VCO to that of a selected frequency. The selected frequency is provided by a reference frequency source 128 which provides a reference frequency at the selected frequency to input line 118 of the phase-frequency detector through a switch 130. With this arrangement, the phase-frequency detector either receives the reference frequency from unit 128 or an input frequency signal along line 118 from an external source, such as an external system clock.

The clock multiplier of FIG. 2 also includes a voltage reference source 132 for generating a fixed reference voltage. The reference voltage is provided to a voltage input 134 of the VCO through a switch 136. With this arrangement, input 134 of the VCO receives either the voltage reference signal or an input voltage from loop filter 116.

Adjustment unit 124, reference sources 128 and 132, and switches 130 and 136 are provided to set the center frequency of VCO 102. This is performed as follows. Initially, adjustment unit 124 is set to provide no course tuning current (or some default current). Switches 130 and 136 are set to provide the reference frequency to phase-frequency detector 112 and the reference voltage to input 134 of the VCO. As such, normal operation of the clock multiplier is suspended. Normal input signals received along path 118 are not connected to the phase-frequency detector. Normal voltage signals generated by loop filter 116 are not provided to the VCO. Rather, the VCO receives only the reference voltage signal and generates an output signal having a frequency responsive thereto. The output frequency is processed by divide-by-N unit 120 and fed back into the phase-frequency detector which also receives the reference frequency.

The phase-frequency detector generates a signal representative of differences between the feedback signal and the reference signal. The output signal of the phase-frequency detector is processed by charge pump 114 and loop filter 116, in accordance with conventional techniques, to produce a voltage on the output of the loop filter. However, the voltage is not connected into the input voltage of the VCO. Rather, the VCO continues to receive only the reference voltage. The signal output by the phase-frequency detector is also received by the center frequency adjustment unit which generates a course tuning current therefrom. Thus the course tuning current, which was initially set to zero, is adjusted to a different amount. More specifically, course tuning current is set to an amount sufficient to cause a change in the center frequency of VCO 102 to yield an output frequency which, when divided by unit 120, more closely approximates the reference frequency than previously. Details regarding the manner by which the adjustment unit calculates and generates an appropriate course tuning current will be described in greater detail below.

Thus, once the course tuning current is adjusted from zero, the center frequency of the VCO is adjusted by an amount sufficient to decrease any difference between the reference frequency and the feedback frequency as received by the phase-frequency detector. The output signal from the phase-frequency detector thereby changes and the adjustment unit responds thereto by calculating and generating a new course tuning current sufficient to further modify the center frequency of the VCO to further reduce the difference between the reference frequency and the feedback frequency received by the phase-frequency detector. This process continues iteratively until the feedback frequency is equal to the reference frequency to a desired degree of resolution. Once that occurs, switches 130 and 136 are reset to allow an input frequency signal to be received by the phase-frequency detector along path 118 and to allow a voltage generated by loop filter 116 to be received by the VCO. The course tuning current, however, continues to be applied to the VCO to maintain the center frequency at the selected frequency. Thereafter, operation of the VCO is biased to the new center frequency. Although not shown, a separate control unit may be provided for coordinating operation of adjustment unit 124 and switches 130 and 136. The control unit may also provide the selected center frequency to the frequency reference unit based upon, for example, external programming by a user.

Figure 3:
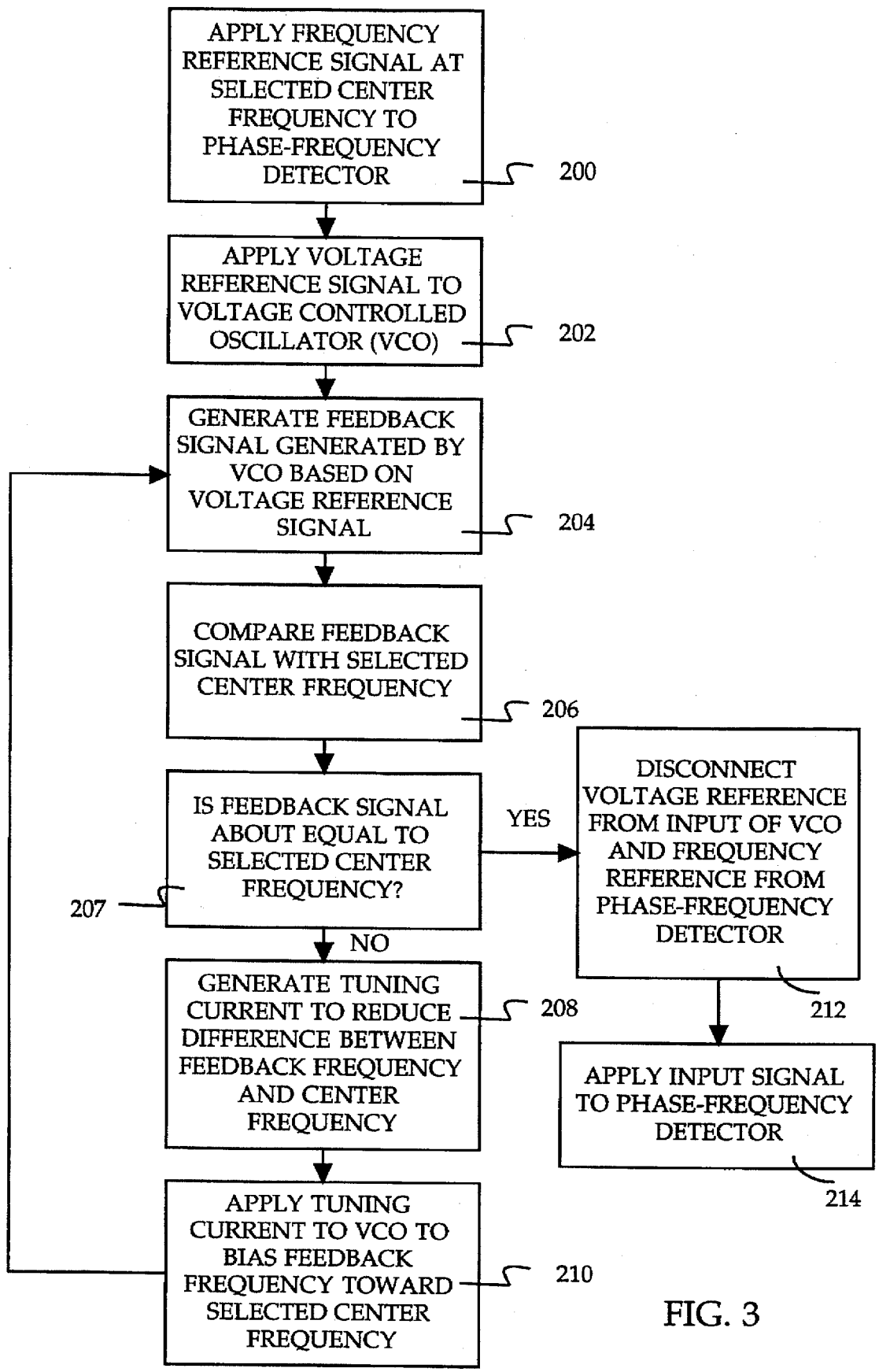
FIG. 3 is a flowchart illustrating a method of resetting the center frequency of the VCO of the clock multiplier of FIG. 2.

FIG. 3 is a flowchart summarizing the method for resetting the center frequency of the VCO employed in connection with the system of FIG. 2. Initially, at step 200, a frequency reference signal is applied to an input of the phase-frequency detector with the frequency reference signal set to a selected center frequency. Next, at step 202, a voltage reference signal is applied to the input of the VCO. An output frequency signal is generated by the VCO, step 204, in response thereto. The output frequency signal from the VCO (divided by N) is compared to the selected center frequency, as represented by the frequency reference signal at step 206. A course tuning current signal is generated, at step 208, which is representative of a difference between the output frequency and the select center frequency. At 210, the course tuning current signal is applied to the VCO to bias the VCO toward the selected center frequency.

Steps 204–210 are repeated iteratively until the output frequency of the VCO (divided by N) is approximately equal to the reference frequency. At that time, step 212 is executed, wherein the voltage reference source is disconnected from the voltage input of the VCO and the frequency reference signal is disconnected from the input of the phase-frequency detector. Thereafter, at step 214, an input clock signal is processed by the phase-frequency detector and a voltage signal generated by the loop filter is processed by the VCO to yield an output signal having a frequency within a range centered around the selected center frequency.

The selected center frequency is maintained by continuing to apply the course tuning current signal to the VCO throughout operation of the device. If an alternative output frequency is desired that is not within a range that can be reliably produced by the VCO based upon the current center frequency, then the steps of FIG. 3 are re-executed using a new center frequency about equal to the new desired output frequency. During operation of an IC incorporating the clock multiplier of FIG. 2, the center frequency may be reset an arbitrary number of times to accommodate different selected output frequencies. The ability to reset the center frequency of the VCO is particularly desirable for use within ICs operating within environments wherein the internal clock rate of the IC may need to be modified, perhaps to accommodate the interconnection of different devices or perhaps to reduce power.

The operation of the frequency adjustment unit and the VCO will now be described in greater detail. As noted, the adjustment unit generates a course tuning current which sets the center frequency for the VCO. During each iteration, the course tuning current is adjusted to change the center frequency by an amount sufficient to reduce a difference between the reference frequency and the feedback frequency as input by the phase-frequency detector. To this end, the VCO is configured to operate with center frequencies from $f_{min}$ to $f_{max}$. The adjustment unit is configured to output course tuning currents in the range of $I_{min}$ to $I_{max}$. The adjustment unit and VCO are configured such that a course tuning current of $I_{min}$ yields a center frequency of $f_{min}$ and a course tuning current of $I_{max}$ yields a center frequency of $f_{max}$. Initially, the course tuning current is set to a default value such as $I_{min}+(I_{max}-I_{min})/2$. Likewise, the center frequency is set to a default value such as $f_{min}+(f_{max}-f_{min})/2$. Accordingly, the initial feedback frequency is about equal to the initial default center frequency. If the reference frequency is less than the initial default center frequency, then the phase-frequency detector will output a signal to that effect and the adjustment unit will decrease the course tuning current, perhaps to a value of $I_{min}+(I_{max}-I_{min})/4$ yielding a new center frequency of about $f_{min}+(f_{max}-f_{min})/4$ and a corresponding feedback frequency. If the feedback frequency continues to be greater than the reference frequency, then the adjustment unit again lowers the course tuning current perhaps to $I_{min}+(I_{max}-I_{min})/8$. If, at any point, the feedback frequency is found to be less than the reference frequency, then the adjustment unit incrementally increases the course tuning current to incrementally increase the center frequency and the resulting feedback frequency.

Hence, with each iteration, the center frequency is incrementally adjusted to reduce differences between the feedback frequency and the reference frequency. By providing smaller and smaller incremental adjustments with each iteration, the system thereby more closely approximates the reference frequency with the center frequency. In other words, the center frequency of the VCO converges on the reference frequency to a resolution dependent upon the number of iterations. The number of iterations required will depend upon the specific application involved and the voltage gain characteristics of the VCO. If, for example, the VCO is configured to operate reliably only within a very narrow bandwidth around a center frequency, then the center frequency should be set fairly precisely to ensure that any subsequently received frequency signals will be within the range of reliable operation defined by the center frequency. If the VCO gain characteristics are such that a relatively wide bandwidth of reliable frequencies may be processed then a less precise center frequency is needed and fewer iterations are therefrom required.

It should be noted that there may be some fluctuations in the feedback signal immediately following a resetting of the course tuning current. The overall system should be configured to damp out the fluctuations before the adjustment unit generates a new course tuning current. In the alternative, the adjustment unit should be configured to sample the output of the phase-frequency detector only after a sufficient amount of time has elapsed to ensure that the output frequency of the VCO has settled.

Figure 4:
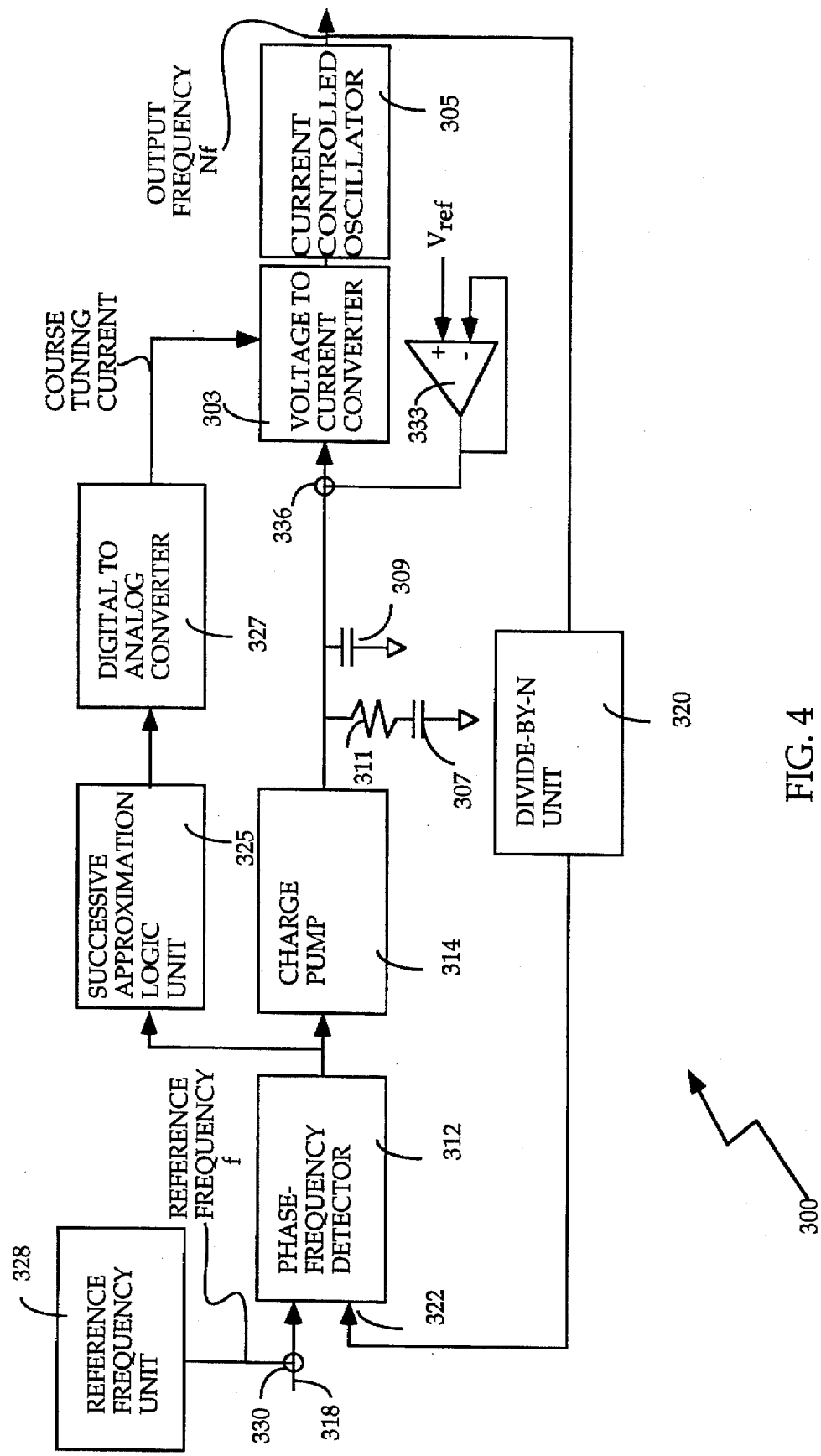
FIG. 4 is a block diagram, partially in a schematic form, of a specific exemplary embodiment of the clock multiplier of FIG. 2.
Figure 5:
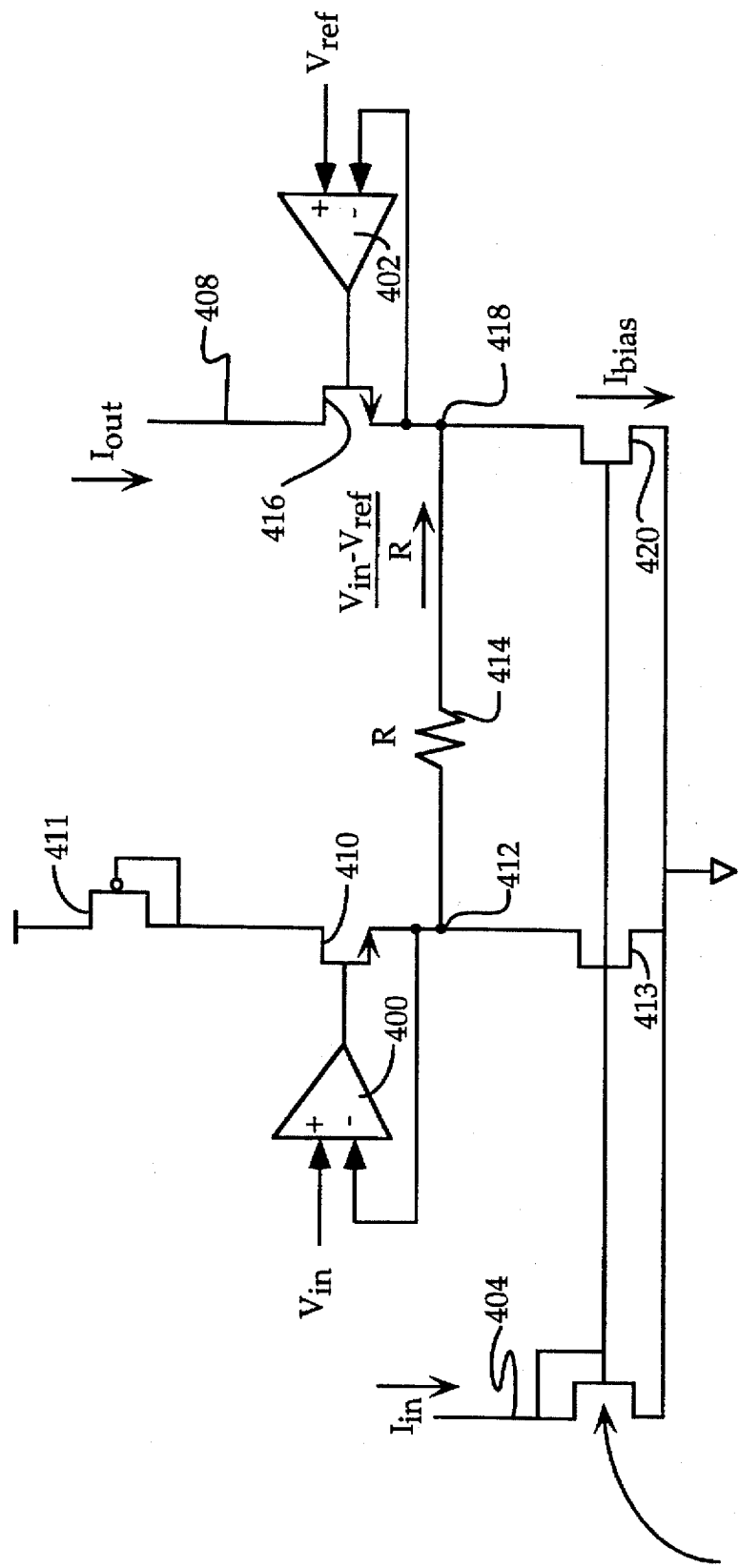
FIG. 5 is a schematic illustration of a specific exemplary VCO for use with the embodiment of FIG. 4.

Referring to FIGS. 4 and 5, a specific exemplary implementation of the system of FIG. 2 will now be described. FIG. 4 is similar to that of FIG. 2 but illustrates a clock multiplier in somewhat greater detail. Like components are referenced by like reference numerals, incremented by 200. Components already described, or which are otherwise conventional, will not further be described. Rather, only pertinent differences between the clock multiplier of FIG. 4 and that of FIG. 2 will be described.

In FIG. 4, VCO 302 is shown incorporating two components: a voltage to current converter (VICON) 303 and current controlled oscillator (ICO) 305. ICO 305 may be conventional. VICON 303, however, differs from conventional units in that it is configured to receive the course tuning current and to bias or trim the center frequency in response to the course tuning current. A specific circuit implementation of an appropriate VICON will be described below with reference to FIG. 5.

Continuing with FIG. 4, internal components of loop filter 116 are illustrated. More specifically, the loop filter includes a pair of capacitors 307 and 309 and a resistor 311, configured as shown. Components of voltage reference source 332 are also set forth. In particular, the voltage reference source includes an op amp 333 having one input connected to a voltage reference signal and a second input connected as a feedback input from an output of the op amp. With this configuration, the voltage reference source operates as a buffered voltage source to maintain the reference voltage precisely at $V_{ref}$.

Individual components of adjustment unit 124 are also shown. In particular, the adjustment unit includes a successive approximation logic unit 325 and a DAC 327 connected sequentially between the phase-frequency detector and the VICON. Logic until 325 is configured to output a binary signal representative of a new course tuning current. DAC 327 is configured to output the course tuning current, based upon the binary signal received, and scaled between $I_{max}$ and $I_{min}$. The number of digits in the binary signal output by the logic unit increases with each iteration until a maximum resolution is achieved. Hence, if 8 iterations are desired, then logic unit 325 ultimately outputs an 8 digit binary signal in the range of 11111111 to 00000000. The DAC outputs a course tuning current of $I_{max}$ in response to a binary value of 11111111 and a current of $I_{min}$ in response to a binary value of 00000000. All other binary sequences output by the logic unit are scaled accordingly between those two extremes to yield a course tuning current somewhere between $I_{max}$ and $I_{min}$. Hence, after the final iteration, a course tuning current having a resolution of $\frac{1}{2}^8$ is achieved yielding a center frequency also set to a resolution $\frac{1}{2}^8$. For the general case, where N iterations are employed, a resolution of $\frac{1}{2}^N$ is achieved.

During the first iteration, the logic outputs a binary word in which the most significant digit is set to "1", while the rest of the digits are set to "0". In one arrangement, the phase-frequency detector outputs either an UP signal or a DOWN signal depending upon whether the feedback frequency needs to be adjusted upwardly or downwardly compared to the reference frequency. Hence, if the feedback frequency is found to be below the reference frequency an UP signal is generated. A DOWN signal is generated otherwise. During the next iteration, the logic sets the next most significant digit to a "1" and sets the previous bit to a "1" if the UP signal was asserted in the previous step or to a "0" if the DOWN signal was asserted in the previous step.

Table I, below, provides exemplary values for an application wherein the frequency reference value is about equal to $f_{min}$. The table provides the resulting course tuning currents, center frequencies and feedback frequencies for each iterative step. The table also indicates whether the phase-frequency detector outputs an UP signal or a DOWN signal and also provides the binary value generated by the logic unit in response thereto. As can be seen in the example of Table 1, each signal received by the logic unit is a DOWN signal, hence a zero is added to the binary value during each iteration. This is because the reference frequency is at the lowest end of the range of acceptable center frequencies of the VICON. Hence, the center frequency is incrementally lowered, from a starting value of $f_{min}+(f_{max}-f_{min})/2$ until reaching a value of $f_{min}$.

TABLE I

| $I_{Course}$ | Current Center Frequency | UP/DOWN Signal | Binary Value |
|---|---|---|---|
| $I_{min} + (I_{max}-I_{min})/2$ | $f_{min} + (f_{max}-f_{min})/2$ | DOWN | 10000000 |
| $I_{min} + (I_{max}-I_{min})/4$ | $f_{min} + (f_{max}-f_{min})/4$ | DOWN | 01000000 |
| $I_{min} + (I_{max}-I_{min})/8$ | $f_{min} + (f_{max}-f_{min})/8$ | DOWN | 00100000 |
| $I_{min} + (I_{max}-I_{min})/16$ | $f_{min} + (f_{max}-f_{min})/16$ | DOWN | 00010000 |
| $I_{min} + (I_{max}-I_{min})/32$ | $f_{min} + (f_{max}-f_{min})/32$ | DOWN | 00001000 |
| $I_{min} + (I_{max}-I_{min})/64$ | $f_{min} + (f_{max}-f_{min})/64$ | DOWN | 00000100 |
| $I_{min} + (I_{max}-I_{min})/128$ | $f_{min} + (f_{max}-f_{min})/128$ | DOWN | 00000010 |
| $I_{min} + (I_{max}-I_{min})/256$ | $f_{min} + (f_{max}-f_{min})/256$ | DOWN | 00000001 |
| $I_{min}$ | $f_{min}$ | DON'T CARE | 00000000 Final Value |

In other examples, if the reference frequency were near $f_{max}$, then each signal received by the logic unit would be an UP signal and the resulting final binary value would include all ones. If the reference frequency were near the default starting center frequency (i.e., near $f_{min}+(f_{max}-f_{min})/2$), then the final binary value would likely be either 10000000 or 01111111, both of which are about midway between 11111111 and 00000000.

The approximation logic may be implemented as a state machine in accordance with conventional techniques. Other implementations may be employed as well. As noted, in the implementation of FIG. 4, the phase-frequency detector merely outputs either an UP signal or a DOWN signal. In other implementations, the detector may output a signal which also represents the difference between the feedback signal and the reference frequency signal. In other words, the detector may be configured to output a signal which indicates the magnitude of any difference, rather than merely the sign of the difference (i.e., UP or DOWN). With such a detector, the approximation logic may be configured to exploit the additional information provided by the detector to more quickly converge on a binary value representing the amount of current necessary to achieve the desired center frequency. As can be appreciated, a wide range of implementations are available consistent with the principles of the invention.

FIG. 5 provides a schematic illustration of one possible implementation of the VICON of FIG. 4. Briefly, the VICON includes a pair of op amps 400 and 402 configured as voltage buffers with op amp 400 receiving the input voltage signal (from switch 336 of FIG. 4) and with op amp 402 receiving the voltage reference signal (from op amp 333 of FIG. 4). The course tuning current is received at input 404 through a current mirror 406. An output of the VICON is generated at 408. The output is a current signal ($I_{out}$) which is received by the ICO (ICO 305 of FIG. 4). Thus the VICON includes three inputs and one output.

Op amp 400 is connected through a transistor device 410 to a node 412 and to a pair of additional transistor devices 411 and 413 connected, as shown, between a high voltage source and a ground. Node 412 is also connected to one side of a resistor (R) 414. Op amp 402 is connected through a transistor device for 16 to a node for 18 on the other side of the resistor. Accordingly, the resistor "sees" different voltages and allows a current representative of the difference in voltages to pass between nodes 412 and 418. More specifically, a current of $(V_{in}-V_{ref})/R$ is provided at node 418. Node 418 is connected through a transistor device 420 to a ground and operates to conduct a biased current $I_{bias}$. With this arrangement, the current conducted through node 418 is $I_{out}-I_{bias}$ which must equal $(V_{in}-V_{ref})/R$. In other words, the resulting output current signal transmitted to the ICO is represented by the following equation:

$$I_{out} = I_{bias} - \frac{V_{in} - V_{ref}}{R}$$

With this equation, if $V_{in}$ is equal to $V_{ref}$, then $I_{out}$ is equal to $I_{bias}$. $I_{bias}$ itself represents a mirrored version of the course tuning current $I_{in}$. Hence, the output current is related to the input course tuning current while the VICON is being set (at which time $V_{in}$ is necessarily equal to $V_{ref}$).

As noted, an output signal is provided at 408 for controlling the ICO. The ICO may be entirely conventional and will not be described in great detail. Other suitable ICO designs may be employed. Of course, other implementations of the VICON may also be employed.

What has been described is a clock multiplying phase locked loop circuit or system that includes means for resetting or biasing the center frequency of a VCO. The clock multiplier circuit or system, and various components thereof, may be configured in a wide range of implementations. The embodiments described herein are intended merely to illustrate exemplary implementations and those embodiments should not be construed as limiting the scope of the invention. In one alternative embodiment, rather than having a user program a reference frequency, the clock multiplying circuit or system may be provided with a center frequency detection unit which examines representative input signals and determines therefrom an appropriate center frequency. The center frequency detection unit then transmits the selected reference frequency to the reference frequency generator for use in setting the center frequency of the VCO to the selected frequency. In this manner, the system or circuit automatically adapts the center frequency to input frequencies without requiring any explicit user selection.

What is claimed is:

1. In a clock multiplier having a phase-locked loop including a phase-frequency detector and a voltage controlled oscillator wherein the voltage control oscillator outputs a signal having a frequency at some multiple of an input frequency received by the phase-frequency detector based upon a center frequency, an improvement directed to setting a center frequency of the voltage controlled oscillator, said improvement comprising:

a frequency reference source means, connected to an input of the phase-frequency detector, for providing a frequency reference signal at a selected center frequency;

adjustment means, connected between the phase-frequency detector and a course tuning input of the voltage controlled oscillator, for generating a course tuning current;

a voltage reference source means, connected to a voltage input of the voltage controlled oscillator, for providing a voltage reference signal;

means within the voltage controlled oscillator for biasing an output frequency using the course tuning current until a stable output frequency is achieved based upon the reference frequency; and means for disconnecting the frequency reference source from the input of the phase-frequency detector and the voltage reference signal from the input of the voltage controlled oscillator to allow an input clock signal received by the phase-frequency detector to be multiplied by the voltage controlled oscillator as biased by the course tuning current.

2. The improvement of claim 1 wherein the means for providing a course tuning current comprises:

successive approximation logic means, connected to an output of the phase-frequency detector, for receiving a signal representative of a difference between a frequency output from the voltage controlled oscillator and for outputting a digital signal approximation of a course tuning current value necessary to minimize the difference in frequency, said approximation being iteratively refined as a function of time; and digital to analog converter means for generating the course tuning current signal as a function of the digital signal output from the successive approximation logic means.

3. The improvement of claim 1 wherein the means for providing a voltage reference comprises:

an operational amplifier having a first input connected to a voltage reference source and a second input connected to a feedback output of the operational amplifier; and a switch interconnecting the output of the operational amplifier and the voltage input of the voltage controlled oscillator.

4. A method for setting a voltage controlled oscillator to a selected center frequency for use within a clock multiplier containing the voltage controlled oscillator and phase-frequency detector configured within a feedback loop, said method comprising the steps of:

applying a frequency reference signal to an input of the phase-frequency detector at the selected center frequency;

applying a voltage reference signal to an input of the voltage controlled oscillator and generating a feedback frequency signal from the voltage controlled oscillator in response thereto;

iteratively comparing the feedback frequency signal from the voltage controlled oscillator to the selected center frequency, generating a course tuning current signal for reducing a difference between the output frequency and the selected center frequency, and applying the course tuning current signal to the voltage controlled oscillator until the voltage controlled oscillator is biased to the selected center frequency; and disconnecting the voltage reference source from the voltage input of the voltage controlled oscillator and disconnecting the frequency reference signal from an input of phase-frequency detector and instead inputting a clock signal.

5. A clock multiplying phase lock looped circuit comprising:

a phase-frequency detector for receiving an input clock signal and a feedback clock signal and for outputting a signal representative of phase/frequency differences therebetween;

a charge pump for receiving the output signal from the phase-frequency detector and for inputting or outputting an amount of charge in response thereto;

a loop filter, including one or more capacitors, for maintaining an amount of charge in response to operation of the charge pump;

a voltage controlled oscillator having a voltage input signal connected to an output of the loop filter for generating an output clock signal having a frequency representative of the input voltage signal but multiplied by a predetermined factor N, said voltage controlled oscillator also having a voltage reference signal input and a course tuning current input;

a divide-by-N circuit interconnecting an output of the voltage controlled oscillator and the feedback input of the phase-frequency detector;

a voltage reference source for providing a reference voltage to the voltage controlled oscillator and for selectively providing the reference voltage also to the input voltage input of the voltage controlled oscillator;

a reference frequency source for selectively providing a reference frequency as an input frequency to the phase-frequency detector; and an adjustment unit, connected between the output of the phase-frequency detector and the course tuning current input of the voltage controlled oscillator, for generating a course tuning current signal selected to minimize differences between the frequency reference signal and the feedback frequency reference signal, said course tuning current maintaining a center frequency of the voltage controlled oscillator at approximately the reference frequency.

6. The circuit of claim 5 wherein the adjustment unit includes:

a successive approximation logic unit for generating a binary signal for reducing differences between the frequency reference signal and the output frequency from the phase-frequency detector; and a digital to analog converter for converting the binary signal into the course tuning current signal.

7. The circuit of claim 5 wherein the voltage reference source comprises:

an operational amplifier having a first input connected to a voltage reference signal and a second input connected to a feedback output of the operation amplifier; and a switch connected between the output of the operational amplifier and the voltage input of the voltage controlled oscillator.

8. The circuit of claim 5 wherein the voltage controlled oscillator comprises a voltage to current converter and a current controlled oscillator.

9. The circuit of claim 8 wherein the voltage to current converter comprises:

a resistor interconnecting first and second nodes, with said first node interconnected between a fixed high voltage source and a ground and with said second node connected between a current output node and a ground;

a first voltage buffer connected between the voltage input and the first node;

a second voltage buffer connected between the voltage reference input and the second node; and a current mirror interconnecting the course tuning current input, the first and second nodes, and the ground, with the current mirror being connected to the second node through a transistor device conducting a bias current such that the output current equals the bias current minus a difference between the input voltage and the reference voltage, said difference being first divided by the resistance of said resistor.

10. The circuit of claim 8 wherein the voltage to current converter is configured to generate an output current equal to a bias current minus a difference between an input voltage and a reference voltage, said difference being first divided by the resistance of said resistor.

11. A clock multiplier circuit comprising:

a phase locked loop circuit including a phase-frequency detector and a voltage controlled oscillator;

a frequency reference source, connected to an input of the phase-frequency detector, for providing a frequency reference signal at a selected center frequency;

adjustment unit, connected between the phase-frequency detector and a course tuning input of the voltage controlled oscillator, for generating a course tuning current;

a voltage reference source, connected to a voltage input of the voltage controlled oscillator, for providing a voltage reference signal;

circuitry within the voltage controlled oscillator for biasing an output frequency using the course tuning current until a stable output frequency is achieved based upon the reference frequency; and switches for disconnecting the frequency reference source from the input of the phase-frequency detector and the voltage reference signal from the input of the voltage controlled oscillator to allow an input clock signal received by the phase-frequency detector to be multiplied by the voltage controlled oscillator as biased by the course tuning current.

12. The circuit of claim 11 wherein the adjustment unit comprises:

successive approximation logic unit, connected to an output of the phase-frequency detector, for receiving a sisal representative of a difference between a frequency output from the voltage controlled oscillator and the frequency reference and for outputting a digital sisal approximation of a course tuning current value necessary to minimize the difference in frequency, said approximation being iteratively refined as a function of time; and digital to analog converter for generating the course tuning current signal as a function of the digital signal output from the successive approximation logic unit.

13. The circuit of claim 11 wherein the voltage reference source comprises:

an operational amplifier having a first input connected to a voltage reference source and a second input connected to a feedback output of the operational amplifier; and a switch interconnecting the output of the operational amplifier and the voltage input of the voltage controlled oscillator.

* * * * *